(12) United States Patent
Saegusa

(10) Patent No.: US 6,343,105 B1
(45) Date of Patent: Jan. 29, 2002

(54) VITERBI DECODER

(75) Inventor: Yasuhiro Saegusa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/095,056

(22) Filed: Jun. 10, 1998

(30) Foreign Application Priority Data

Jun. 10, 1997 (JP) ............................................ 9-152461

(51) Int. Cl.$^7$ ................................................ H03D 1/00
(52) U.S. Cl. .................................................... 375/341
(58) Field of Search ................................ 375/341, 262; 327/68; 714/795, 789, 796

(56) References Cited

U.S. PATENT DOCUMENTS

| | | | | |
|---|---|---|---|---|
| 4,574,206 A | * | 3/1986 | Todokoro et al. | 327/68 |
| 4,614,922 A | | 9/1986 | Bauman et al. | 333/161 |
| 4,614,933 A | * | 9/1986 | Yamashita et al. | 341/51 |
| 5,410,555 A | * | 4/1995 | Itakura et al. | 714/795 |

FOREIGN PATENT DOCUMENTS

| | | |
|---|---|---|
| JP | 60-173930 | 9/1985 |
| JP | 1-44056 | 9/1989 |
| JP | 1-44058 | 9/1989 |
| JP | 3-49217 | 7/1991 |
| JP | 7-13159 | 1/1995 |
| JP | 7-22969 | 1/1995 |
| JP | 7-46145 | 2/1995 |
| JP | 7-273810 | 10/1995 |
| JP | 8-8402 | 1/1996 |
| JP | 8-63337 | 3/1996 |
| JP | 9-36754 | 2/1997 |

OTHER PUBLICATIONS

CB Shung, "Area–Efficient Architectures for the Viterbi Algorithm" Proceedings of the Global Telecommunications Conference and Exhibition (Globecom), US New York, *IEEE*, vol. –, Dec. 2, 2990, pp. 1787–1793 XP00218878 ISBN: 0–87942–632–2.

AK Yeung et al, "WP 5.6: A210MB/S Radix–4 Bit–Level Pipelined Viterbi Decoder" IEEE International Solid state Circuits Conference, US, IEEE Inc. New York vol. 38, Feb. 1, 1995. pp. 88–89, 344 XP000557566 ISSN: 0193–6530.

* cited by examiner

*Primary Examiner*—Chi Pham
*Assistant Examiner*—Kevin M Burd
(74) *Attorney, Agent, or Firm*—Sughrue, Mion, PLLC

(57) ABSTRACT

Disclosed is a viterbi decoder including flip-flops or latches inserted between respective calculation units for performing path-metric value read processing, arithmetic processing, addition processing, comparison/selection processing, updated path-metric value storage processing, and minimum path-metric value update processing. The leading and trailing edges of a clock signal or two-phase signals are alternately used to perform parallel pipeline processing for the calculation units.

8 Claims, 7 Drawing Sheets

VITERBI DECODER

BACKGROUND OF THE INVENTION

1. Field of the Invention

The present invention relates to a viterbi decoder used for mobile communication, satellite communication, and a memory device and, more particularly, to a viterbi decoder for time-divisionally performing series arithmetic processing in an ACS (Add-Compare-Select) circuit.

2. Description of the Prior Art

A viterbi decoder is used for maximum likelihood decoding of convolution codes to select, as a maximum likelihood path, a path whose inter-code distance is the nearest to, of a plurality of known code sequences, a reception code sequence and to set data corresponding to the selected path as decoded data.

Conventional viterbi decoders are classified into a scheme (parallel scheme) of performing calculation and comparison of path-metric values in the ACS circuit parallel for all states by arranging ACS circuits equal in number to states, and a scheme (series scheme) of time-divisionally performing series arithmetic processing in the ACS circuit by one ACS circuit.

For example, Japanese Examined Patent Publication No. 1-44058 discloses a viterbi decoder for pipeline processing in an ACS circuit in order to increase the throughput of the viterbi decoder. This viterbi decoder is of the parallel scheme in which ACS circuits are arranged equal in number to states. By doubling the numbers of adders and metric memories in each ACS circuit, pipeline processing of comparing the path-metric values of previous sum outputs by a comparator in a decoding cycle of adding outputs by an adder is realized.

Japanese Examined Patent Publication No. 3-49217 also discloses a viterbi decoder for pipeline processing in an ACS circuit in order to increase the throughput of the viterbi decoder. This viterbi decoder is also of the parallel scheme in which ACS circuits are arranged equal in number to states. Pipeline processing is realized on the decoder side by encoding transmission information sequences after dividing them into even sequences and odd sequences on the encoder side. In a convolution encoder, one conventional delay flip-flop is replaced with two shift registers. In the viterbi decoder, one clock delay circuit is inserted between an adder group and a comparator/selector group. With this arrangement, pipeline processing of separately executing addition and comparison/selection using one clock is realized.

A viterbi decoder of time-divisionally performing series arithmetic processing in a conventional ACS circuit will be explained. This prior art will exemplify decoding of a convolution code with a code ratio R=1/2 and a guide distance K=3. The number of states in the viterbi decoder is therefore four. The arrangement of the viterbi decoder will be first explained. FIG. 1 is a block diagram showing a path-metric calculation unit 12 and a minimum path-metric value detector 13 in a viterbi decoder of time-divisionally performing series arithmetic processing in a conventional ACS circuit.

The path-metric calculation unit 12 is a so-called ACS circuit, which adds, compares, and selects path-metric values. The path-metric calculation unit comprises a path-metric X memory 20 and a path-metric Y memory 21, which store the path-metric values of the respective states, subtracters 22 and 23 for respectively subtracting the minimum path-metric value during one previous decoding time from path-metric values read out from the path-metric memories 20 and 21, adders 24 and 25 for respectively adding branch metrics X and Y and outputs from the subtracters 22 and 23, a comparator 26 for comparing outputs from the adders 24 and 25, and a selector 27 for selecting a smaller one of outputs from the adders 24 and 25.

The minimum path-metric value detector 13 constitutes a comparator 30 for comparing an updated path-metric value as an output from the selector 27 with an output from a flip-flop (FF) 32, a selector 31 for selecting a smaller one of outputs from the selector 27 and the FF 32 in accordance with an output from the comparator 30, the FF 32 for holding an output from the selector 31 at the leading edge of a clock signal CLK, and a level-through latch 33 for holding an output from the FF 32 in accordance with a minimum value update signal.

The operation of this viterbi decoder will be described. FIG. 2 is a timing chart of the viterbi decoder in FIG. 1. Since the number of states is four, one decoding time is made up of four clocks during which path-metric values corresponding to states "0" to "3" are calculated for a pair of reception signals. A calculation operation for a path-metric corresponding to state "0" will be explained. A branch metric as the calculation result of the Hamming distance between reception data and a candidate value is input to the path-metric calculation unit 12. Branch metrics X and Y corresponding to two paths conceivable for one state are respectively input to the adders 24 and 25. Branch metrics obtained from candidate values corresponding to transmission from state "0" and state "2" are used for path-metric calculation of state "0". Path-metric values corresponding to the four states are respectively stored in the path-metric X memory 20 and the path-metric Y memory 21. Their contents are the same though (states corresponding to) path-metric values read out at the same timing are different. To calculate the path-metric value of state "0", a path-metric value corresponding to the previous state "0" and a path-metric value corresponding to state "2" are respectively read out from the path-metric X memory 20 and the path-metric Y memory 21. The minimum path-metric value during one previous decoding time is subtracted from the readout path-metric values by the subtracters 22 and 23 in order to prevent the path-metric value from increasing infinitely. The branch metric X and an output from the subtracter 22 are added by the adder 24, whereas the branch metric Y and an output from the subtracter 23 are added by the adder 25. A smaller one of the sums is selected by the comparator 26 and the selector 27 and output as an updated path-metric value to the path-metric X memory 20, the path-metric Y memory 21, and the minimum path-metric value detector 13. The updated path-metric value is stored as the path-metric value of state "0" in the path-metric X memory 20 and the path-metric Y memory 21. The path-metric values of states "1", "2", and "3" are similarly calculated. When the updated path-metric value of state "0" is input to the minimum path-metric value detector 13, it is unconditionally selected by the selector 31 and held by the FF 32 at the leading edge of the clock signal CLK. Upon reception of the updated path-metric value of state "1", it is compared with the path-metric value of the previous state (state "0") by the comparator 30. A smaller value is selected by the selector 31 and held by the FF 32 at the leading edge of the clock signal CLK. The same operation is performed upon reception of the updated path-metric values of states "2" and "3". The minimum one of the path-metric values of the four states is held by the latch 33 in accordance with a minimum value update signal generated every decoding time.

As described above, the conventional viterbi decoder must perform, within the duration of one clock, (1) read of path-metric values from the memories 20 and 21, (2) subtraction of the minimum path-metric value from a pair of previous reception signals by the subtracters 22 and 23, (3) addition of branch metrics by the adders 24 and 25, (4) selection of a smaller value by the comparator 26 and the selector 27, (5) storage of the updated path-metric value in the memories 20 and 21, (6) update of the minimum candidate path-metric value by the comparator 30, the selector 31, and the FF 32, and (7) update of the minimum path-metric value by the latch 33 at the last clock (fourth clock) during the one decoding time.

The viterbi decoders in Japanese Examined Patent Publication Nos. 1-44058 and 3-49217 are of the scheme of performing calculation and comparison of path-metric values in the ACS circuit parallel for all states by arranging ACS circuits equal in number to states. As the guide distance increases, the number of states increases, and the number of necessary ACS circuits also increases, resulting in a large-scale circuit. In Japanese Examined Patent Publication No. 1-44058, the circuit scale increases synergistically because adders and metric memories must be doubled in number and arranged in each ACS circuit in order to realize pipeline processing.

In Japanese Examined Patent Publication No. 3-49217, transmission information sequences are encoded after they are divided into even sequences and odd sequences on the encoder side in order to realize pipeline processing on the decoder side. This requires special encoding data, which cannot be used in a digital portable telephone standard such as GSM, PDC, or IS136 in which the encoding scheme and the transmission format are standardized.

In the viterbi decoder of time-divisionally performing series arithmetic processing in the conventional ACS circuit by one ACS circuit, path-metric values must be read, subtracted, added, compared, selected, and stored, and the minimum path-metric values must be updated within the duration of one clock. Accordingly, the operation frequency is limited by delays in the subtracter, the adder, the comparator, the selector, the memory, and the like, and the throughput of the viterbi decoder is undesirably limited.

SUMMARY OF THE INVENTION

The present invention has been made to solve the above drawbacks in the prior art, and has as its object to provide a viterbi decoder which can be designed to be free from any influence by a delay in each calculation unit while the throughput is increased.

To achieve the above object, according to the present invention, there is provided a viterbi decoder comprising means for performing parallel pipeline processing of path-metric value read processing, subtraction processing, addition processing, comparison/selection processing, updated path-metric value storage processing, and minimum path-metric value update processing in an ACS circuit.

According to the first aspect of the present invention, the decoder further comprises flip-flops or latches inserted between respective calculation units for performing path-metric value read processing, subtraction processing, addition processing, comparison/selection processing, updated path-metric value storage processing, and minimum path-metric value update processing, and leading and trailing edges of a clock signal or two-phase signals are alternately used to perform parallel pipeline processing of the calculation units.

According to the viterbi decoder of the present invention, the delay margin of each calculation unit can be widened, and the width of one clock can be decreased by performing pipelining of the respective arithmetic processes. As a result, high-speed processing can be realized even using the same device technology. Further, the throughput increases because an increase in the number of clocks required for one decoding time is minimized. When the viterbi decoder can operate at a frequency twice as high as the frequency of a viterbi decoder of time-divisionally performing series arithmetic processing in a conventional ACS circuit, one decoding time can be shortened to 5/8, and throughput 1.6 times the throughput of the conventional viterbi decoder can be obtained. In addition, the viterbi decoder of the present invention can be designed more easily because it can be designed to be free from any delay influence due to pipeline processing.

The above and many other objects, features and advantages of the present invention will become manifest to those skilled in the art upon making reference to the following detailed description and accompanying drawings in which preferred embodiments incorporating the principles of the present invention are shown by way of illustrative examples.

DETAILED DESCRIPTION OF PREFERRED EMBODIMENTS

The present invention will be described in detail below with reference to several preferred embodiments shown in the accompanying drawings.

Figure 1:
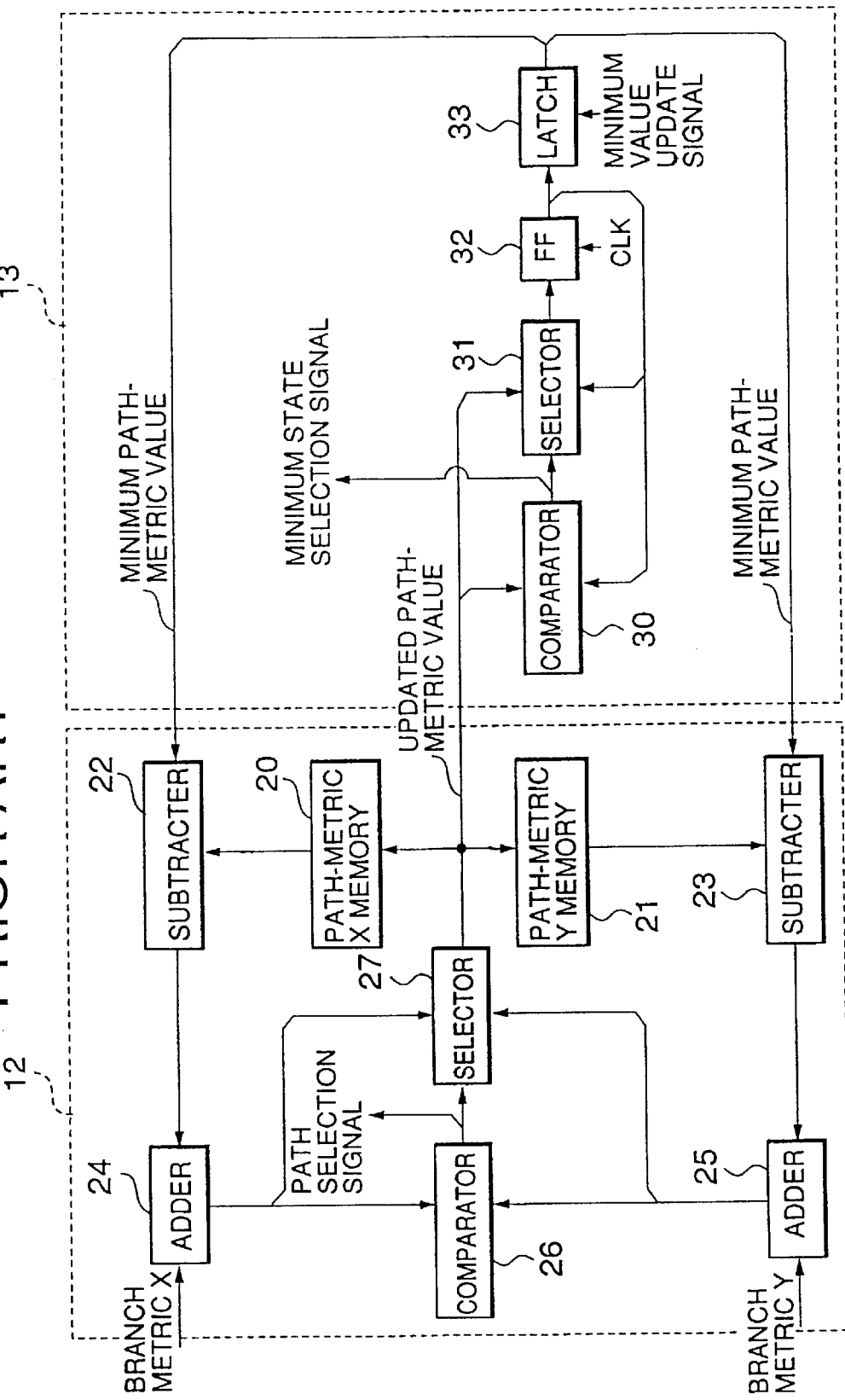
FIG. 1 is block diagram showing a conventional path-metric calculation unit and minimum path-metric value detector.
Figure 2:
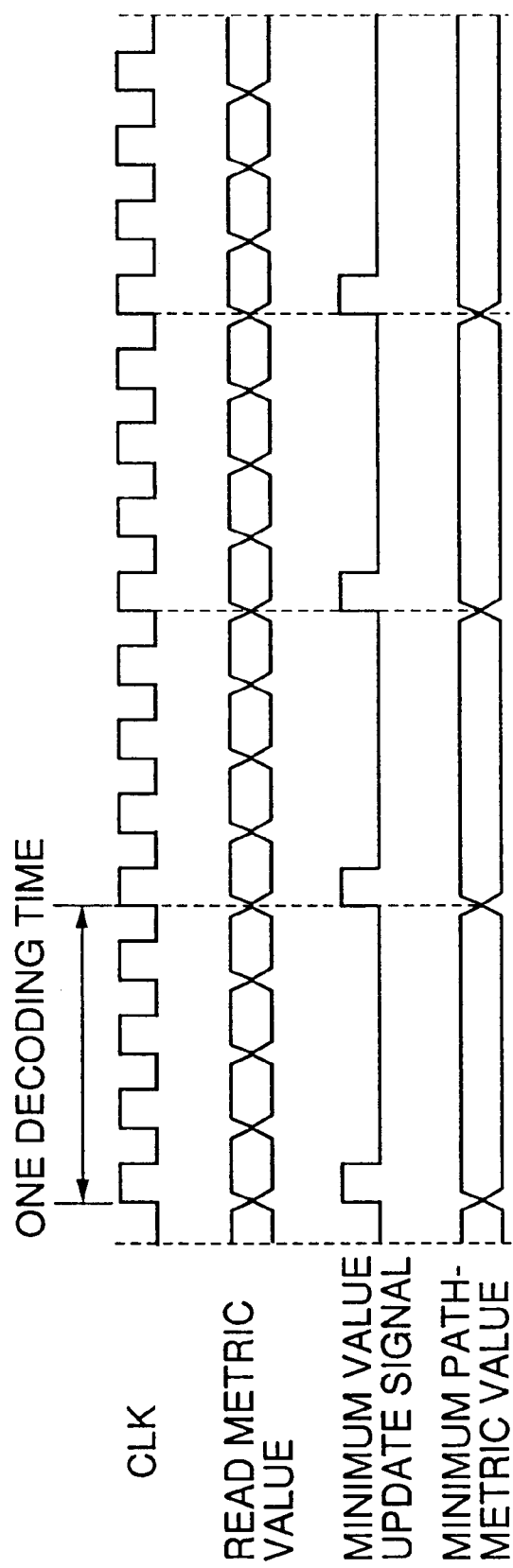
FIG. 2 is an operation timing chart in the prior art.
Figure 3:
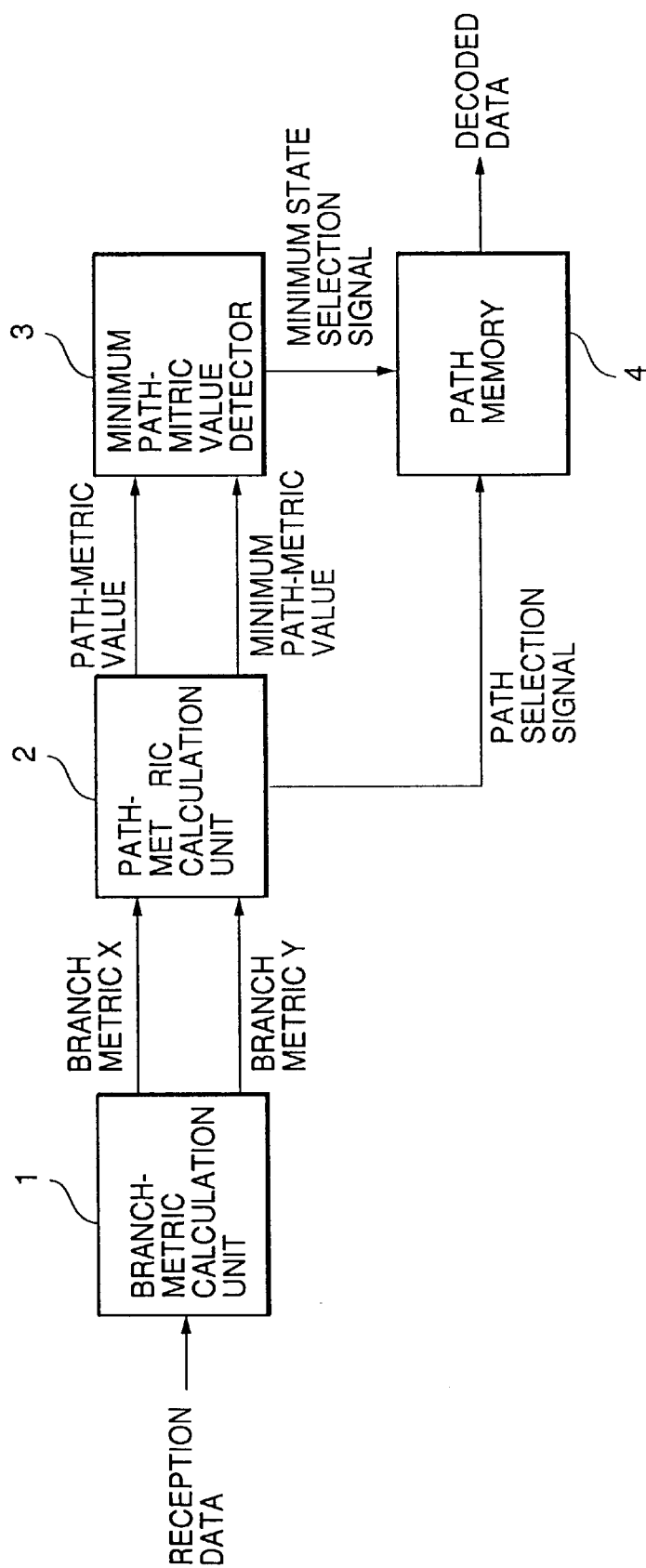
FIG. 3 is a block diagram showing the schematic arrangement of the first embodiment according to the present invention.

FIG. 3 is a block diagram showing the schematic arrangement of a viterbi decoder according to the first embodiment of the present invention. The first embodiment will exemplify decoding of a convolution code with a code ratio R=1/2 and a guide distance K=3. The number of states in which the viterbi decoder is therefore four.

The viterbi decoder according to the first embodiment comprises a branch-metric calculation unit 1 for calculating branch metrics for four states from reception data, a path-metric calculation unit 2 for updating the path-metric by a previous path-metric and a newly obtained branch metric, a minimum path-metric value detector 3 for detecting the minimum one of the path-metrics of the four states, and a path memory 4 for storing the history of the path up to the present in each state and outputting the maximum likelihood data.

The branch-metric calculation unit 1 calculates the Hamming distance between reception data and candidate data for the four states and outputs branch metrics X and Y corresponding to two paths conceivable for one state to the path-metric calculation unit 2. The path-metric calculation unit 2 outputs updated path-metric values for the four states to the minimum path-metric value detector 3 and path selection signals as path information for the four states to the path memory 4 from the branch metrics X and Y, the path-metric values of the respective states stored in the path-metric calculation unit 2, and the minimum path-metric value during one previous decoding time that is input from the minimum path-metric value detector 3. The minimum path-metric value detector 3 detects the minimum one of the path-metric values of the four states and outputs it as a minimum path-metric value. In addition, the minimum path-metric value detector 3 outputs a minimum state selection signal as information of a state with the minimum path-metric value to the path memory 4. The path memory 4 stores the path selection signal as a path history for each state and outputs, as decoding data, the path history of the state selected by the minimum state selection signal.

Figure 4:
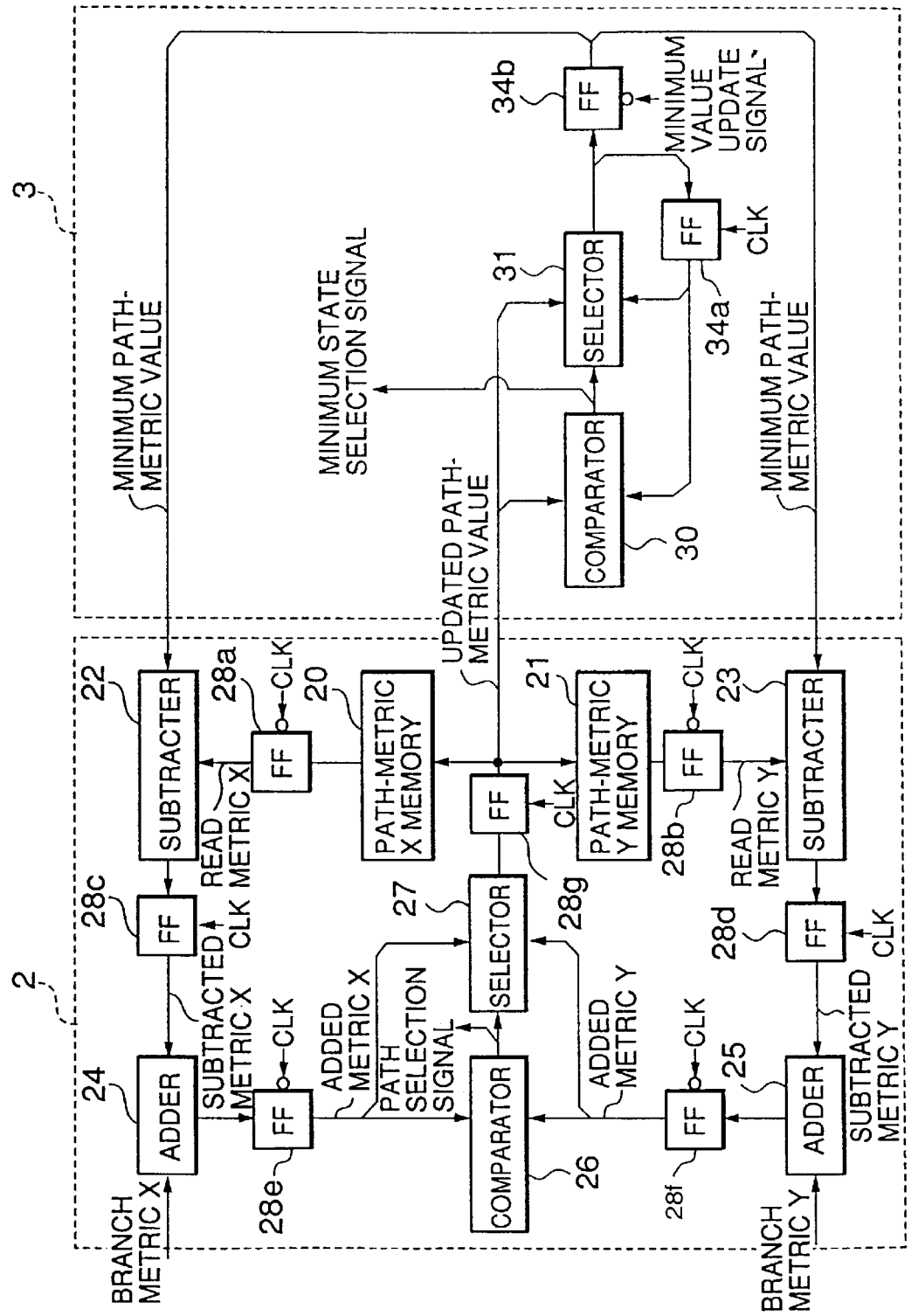
FIG. 4 is a block diagram showing a path-metric calculation unit and a minimum path-metric value detector according to the first embodiment of the present invention.

FIG. 4 is a block diagram showing the path-metric calculation unit 2 and the minimum path-metric value detector 3 according to the first embodiment of the present invention.

The path-metric calculation unit 2 is generally called an ACS circuit, which adds, compares, and selects path-metric values. The path-metric calculation unit 2 comprises a path-metric X memory 20 and a path-metric Y memory 21 which store the path-metric values of the respective states, flip-flops (FFs) 28a and 28b for holding path-metric values read out from the path-metric memories 20 and 21 at the trailing edge of a clock signal CLK, subtracters 22 and 23 for respectively subtracting the minimum path-metric value during one previous decoding time from outputs from the FFs 28a and 28b, FFs 28c and 28d for holding outputs from the subtracters 22 and 23 at the leading edge of the clock signal CLK, adders 24 and 25 for respectively adding branch metrics X and Y and outputs from the FFs 28c and 28d, FFs 28e and 28f for holding outputs from the adders 24 and 25 at the trailing edge of the clock signal CLK, a comparator 26 for comparing outputs from the FFs 28e and 28f, a selector 27 for selecting a smaller one of the outputs from the FFs 28e and 28f, and an FF 28g for holding an output from the selector 27 at the leading edge of the clock signal CLK.

The minimum path-metric value detector 3 is constituted by a comparator 30 for comparing an updated path-metric value as an output from the FF 28g with an output from an FF 34a, a selector 31 for selecting a smaller one of outputs from the FF 28g and the FF 34a in accordance with an output from the comparator 30, the FF 34a for holding an output from the selector 31 at the leading edge of the clock signal CLK, and an FF 34b for holding an output from the selector 31 at the trailing edge of a minimum value update signal.

Figure 5:
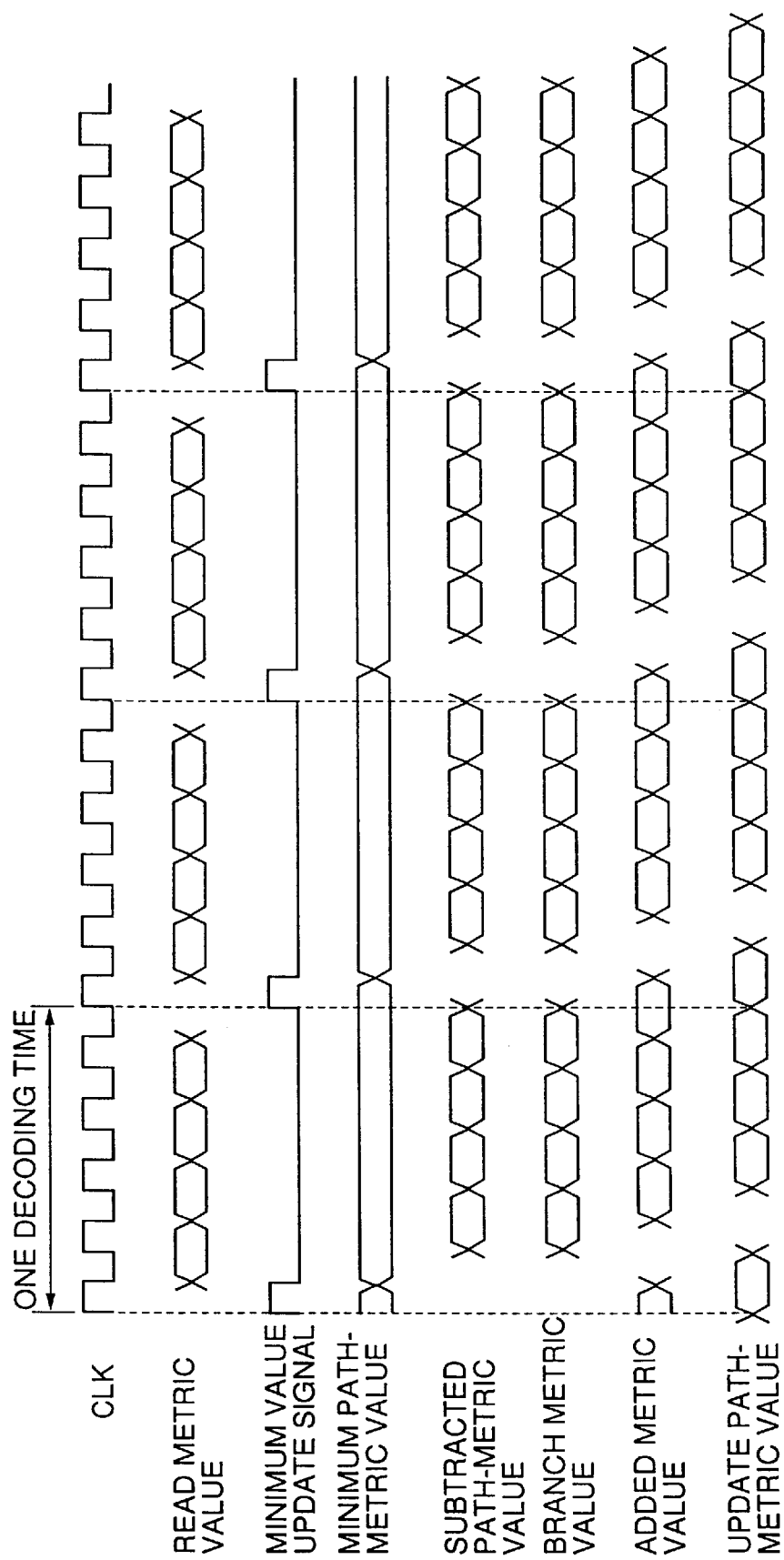
FIG. 5 is an operation timing chart in the first embodiment of the present invention.

The operation of the first embodiment will be described. FIG. 5 is a timing chart of the first embodiment. Since the number of states is four, path-metric values corresponding to states "0" to "3" are calculated for a pair of reception signals. One decoding time is made up of five clocks because respective calculations such as memory read, subtraction, addition, comparison/selection, and update are divided and executed parallel every half the clock cycle. A calculation operation for a path-metric corresponding to state "0" will be explained. A branch metric as the calculation result of the humming distance between reception data and a candidate value is input to the path-metric calculation unit 2. Branch metrics X and Y corresponding to two paths conceivable for one state are respectively input to the adders 24 and 25. Branch metrics obtained from candidate values corresponding to transmission from state "0" and state "2" are used for path-metric calculation of state "0". Path-metric values corresponding to the four states are respectively stored in the path-metric X memory 20 and the path-metric Y memory 21. Their contents are the same though (states corresponding to) path-metric values read out at the same timing are different. To calculate the path-metric value of state "0", a path-metric value corresponding to the previous state "0" and a path-metric value corresponding to state "2" are respectively read out from the path-metric X memory 20 and the path-metric Y memory 21. The path-metric values read out from the path-metric X memory 20 and the path-metric Y memory 21 are respectively held by the FFs 28a and 28b at the trailing edge of the clock signal CLK. The subtracters 22 and 23 subtract the minimum path-metric value during one previous decoding time from the path-metric values held by the FFs 28a and 28b in order to prevent the path-metric value from increasing infinitely. Outputs from the subtracters 22 and 23 are respectively held by the FFs 28c and 28d at the leading edge of the clock signal CLK. The branch metric X and an output from the FF 28c are added by the adder 24, whereas the branch metric Y and an output from the FF 28d are added by the adder 25. The sums are respectively held by the FFs 28e and 28f at the trailing edge of the clock signal CLK. A smaller one of the sums held by the FFs 28e and 28f is selected by the comparator 26 and the selector 27 and held by the FF 28g at the leading edge of the clock signal CLK. An output from the FF 28g is output as an updated path-metric value to the path-metric X memory 20, the path-metric Y memory 21, and the minimum path-metric value detector 3. The updated path-metric value is stored as the path-metric value of state "0" in the path-metric X memory 20 and the path-metric Y memory 21. The path-metric values of states "1", "2", and "3" are similarly calculated. When the updated path-metric value of state "0" is input to the minimum path-metric value detector 3, it is unconditionally selected by the selector 31 and held by the FF 34a at the leading edge of the clock signal CLK. Upon reception of the updated path-metric value of state "1", it is compared with the path-metric value of the previous state (state "0") by the comparator 30. A smaller value is selected by the selector 31 and held by the FF 34a at the leading edge of the clock signal CLK. The same operation is performed upon reception of the updated path-metric values of states "2" and "3". The minimum one of the path-metric values of the four states is held by the FF 34b in accordance with a minimum value update signal generated every decoding time.

As described above, in the first embodiment, the FFs 28a to 28g are inserted between the respective calculation units such as the memory, the subtracter, the adder, and the comparator/selector. By alternately using the leading and trailing edges of the clock signal CLK, respective calculations are performed by parallel pipeline processing. The delay margin of each calculation unit can be widened, and the width of one clock can be decreased. An increase in the number of clocks required for one decoding time can be minimized. The leading and trailing edges of each of the clock signal CLK and the minimum value update signal may be used in a reverse order.

The first embodiment has exemplified decoding of a convolution code with a code ratio R=1/2 and a guide distance K=3, but the present invention is applicable to any convolution code with arbitrary values R and K.

Figure 6:
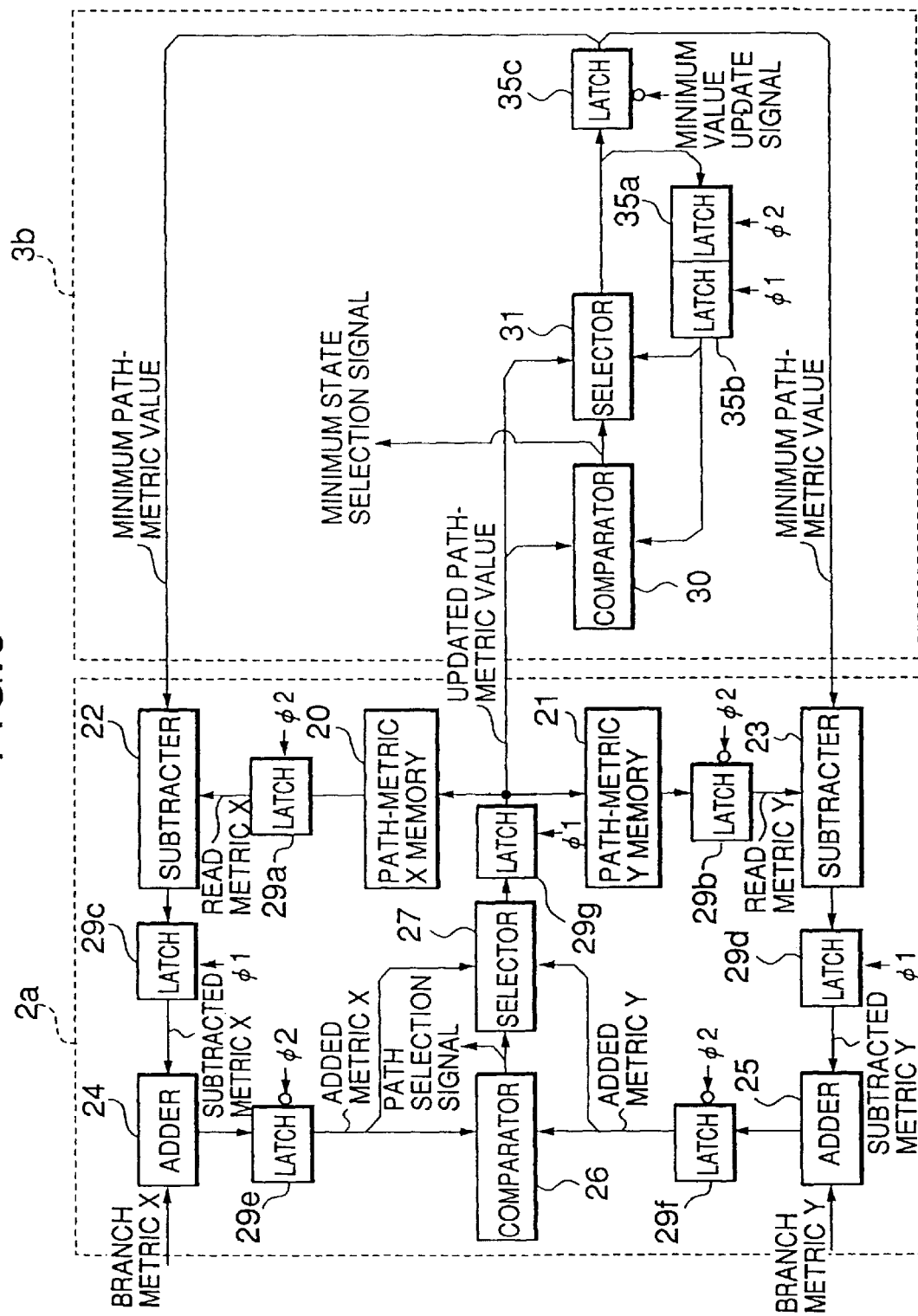
FIG. 6 is a block diagram showing a path-metric calculation unit and a minimum path-metric value detector according to the second embodiment of the present invention.

FIG. 6 is a block diagram showing a path-metric calculation unit 2 and a minimum path-metric value detector 3 according to the second embodiment of the present invention.

The path-metric calculation unit 2 is constituted by a path-metric X memory 20 and a path-metric Y memory 21 which store the path-metric values of respective states, level latches 29a and 29b for holding path-metric values read out from the path-metric memories 20 and 21 in response to a clock signal φ2, subtracters 22 and 23 for respectively subtracting the minimum path-metric value during one previous decoding time from outputs from the latches 29a and 29b, latches 29c and 29d for holding outputs from the subtracters 22 and 23 in response to a clock signal φ1, adders 24 and 25 for respectively adding branch metrics X and Y and outputs from the latches 29c and 29d, latches 29e and 29f for holding outputs from the adders 24 and 25 in response to the clock signal φ2, a comparator 26 for comparing outputs from the latches 29e and 29f, a selector 27 for selecting a smaller one of the outputs from the latches 29e and 29f, and a latch 29g for holding an output from the selector 27 in response to the clock signal φ1.

The minimum path-metric value detector 3 is made up of a comparator 30 for comparing an updated path-metric value as an output from the latch 29g with an output from a latch 35b, a selector 31 for selecting a smaller one of outputs from the latch 29g and the latch 35b in accordance with an output from the comparator 30, a latch 35a for holding an output from the selector 31 in response to the clock signal φ2, the latch 35b for holding an output from the latch 35a in response to the clock signal φ1, and a latch 35c for holding an output from the selector 31 in accordance with a minimum value update signal.

Figure 7:
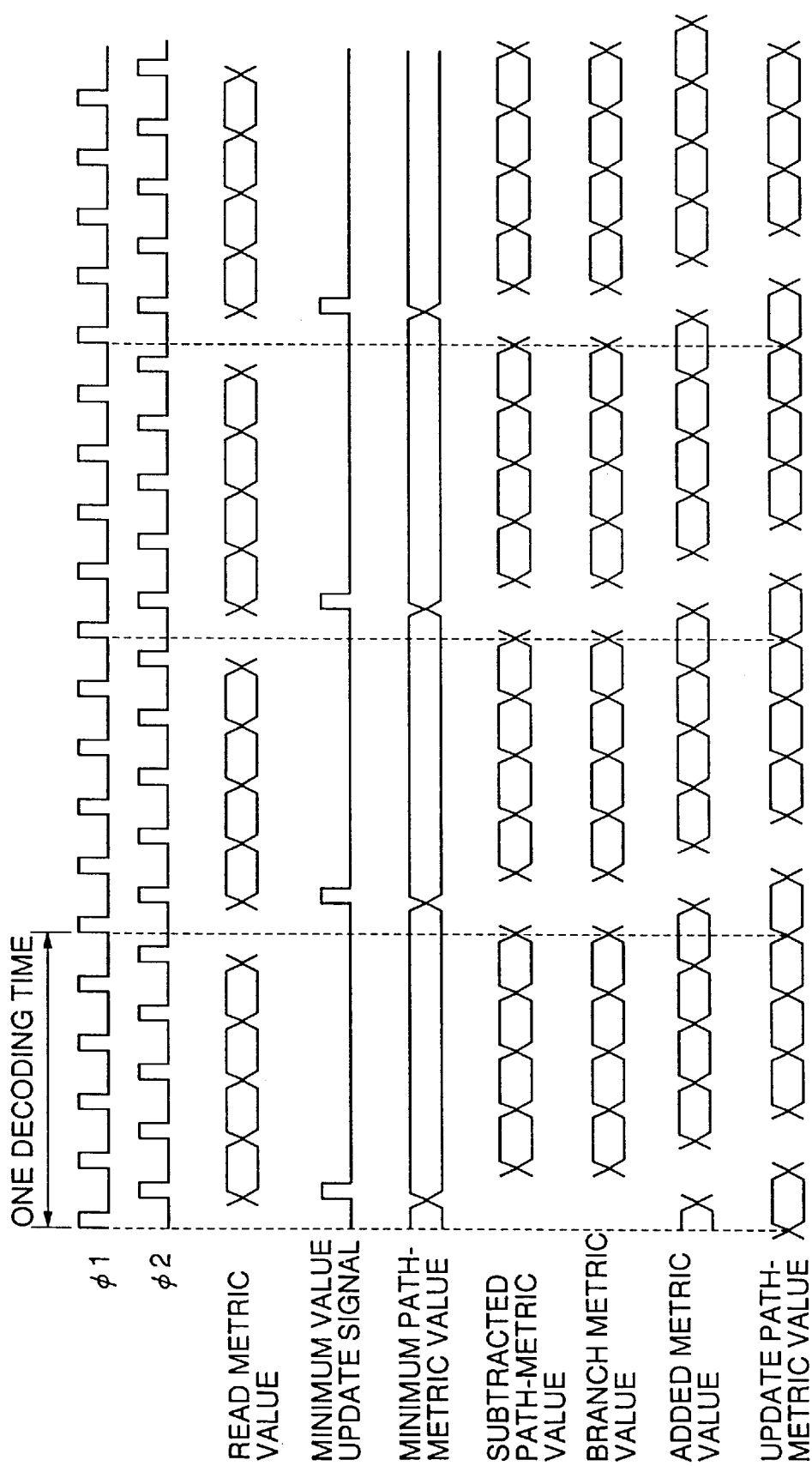
FIG. 7 is an operation timing chart in the second embodiment of the present invention.

The operation of the second embodiment will be described. FIG. 7 is a timing chart of the second embodiment. Since the number of states is four, path-metric values corresponding to states "0" to "3" are calculated for a pair of reception signals. One decoding time is made up of five clocks because respective calculations such as memory read, subtraction, addition, comparison/selection, and update are divided and executed parallel by alternately using the phase clocks φ1 and φ2. A calculation operation for a path-metric corresponding to state "0" will be explained. A branch metric as the calculation result of the Hamming distance between reception data and a candidate value is input to the path-metric calculation unit 2. Branch metrics X and Y corresponding to two paths conceivable for one state are respectively input to the adders 24 and 25. Branch metrics obtained from candidate values corresponding to transmission from state "0" and state "2" are used for path-metric calculation of state "0". Path-metric values corresponding to the four states are respectively stored in the path-metric X memory 20 and the path-metric Y memory 21. Their contents are the same though (states corresponding to) path-metric values read out at the same timing are different. To calculate the path-metric value of state "0", a path-metric value corresponding to the previous state "0" and a path-metric value corresponding to state "2" are respectively read out from the path-metric X memory 20 and the path-metric Y memory 21. The path-metric values read out from the path-metric X memory 20 and the path-metric Y memory 21 are respectively held by the latches 29a and 29b in response to the clock signal φ2. The subtracters 22 and 23 subtract the minimum path-metric value during one previous decoding time from the path-metric values held by the latches 29a and 29b in order to prevent the path-metric value from increasing infinitely. Outputs from the subtracters 22 and 23 are respectively held by the latches 29c and 29d in response to the clock signal φ1. The branch metric X and an output from the latch 29c are added by the adder 24, whereas the branch metric Y and an output from the latch 29d are added by the adder 25. The sums are respectively held by the latches 29e and 29f in response to the clock signal φ2. A smaller one of the sums held by the latches 29e and 29f is selected by the comparator 26 and the selector 27 and held by the latch 29g in response to the clock signal φ1. An output from the latch 29g is output as an updated path-metric value to the path-metric X memory 20, the path-metric Y memory 21, and the minimum path-metric value detector 3. The updated path-metric value is stored as the path-metric value of state "0" in the path-metric X memory 20 and the path-metric Y memory 21. The path-metric values of states "1", "2", and "3" are similarly calculated. When the updated path-metric value of state "0" is input to the minimum path-metric value detector 3b, it is unconditionally selected by the selector 31 and held by the latch 35a in response to the clock signal φ2. An output from the latch 35a is held by the latch 35b in response to the clock signal φ1. Upon reception of the updated path-metric value of state "1", it is compared with the path-metric value of the previous state (state "0") by the comparator 30. A smaller value is selected by the selector 31 and held by the latch 35a in response to the clock signal φ1. The same operation is performed upon reception of the updated path-metric values of states "2" and "3". The minimum one of the path-metric values of the four states is held by the latch 35c in accordance with a minimum value update signal generated every decoding time.

In this manner, according to the second embodiment, the latches 29a to 29g are inserted between the respective calculation units such as the memory, the subtracter, the adder, and the comparator/selector. By alternately using the two-phase clock signals φ1 and φ2, respective calculations are performed by parallel pipeline processing. The delay margin of each calculation unit can be widened, and the width of one clock can be decreased. An increase in the number of clocks required for one decoding time can be minimized.

Note that in the second embodiment, the latches replace the FFs used in the first embodiment by using the two-phase clocks φ1 and φ2. The latch can be realized with almost half the circuit scale of the FF, so that a circuit scale corresponding to 7× (bit length of path-metric) latches can be reduced in the ACS circuit, compared to the first embodiment.

Although the second embodiment has exemplified decoding of a convolution code with a code ratio R=1/2 and a guide distance K=3, the present invention can be applied to any convolution code with arbitrary values R and K.

What is claimed is:

1. A viterbi decoder for time-divisionally series-processing calculation in an ACS circuit, comprising:

a plurality of means for respectively performing parallel pipeline processing of path-metric value read processing, subtraction processing, addition processing, comparison/selection processing, updated path-metric value storage processing, and minimum path-metric value update processing in said ACS circuit; and a plurality of flip-flops disposed between respective means for performing path-metric value read processing, subtraction processing, addition processing, comparison/selection processing, updated path-metric value storage processing, and minimum path-metric value update processing, and wherein said flip-flops enable parallel pipeline processing by alternately using leading and trailing edges of a clock signal.

2. A viterbi decoder for time-divisionally series-processing calculation in an ACS circuit, comprising:

a plurality of means for respectively performing parallel pipeline processing of path-metric value read processing, subtraction processing, addition processing, comparison/selection processing, updated path-metric value storage processing, and minimum path-metric value update processing in said ACS circuit; and a plurality of latches disposed between respective means for performing path-metric value read processing, subtraction processing, addition processing, comparison/ selection processing, updated path-metric value storage processing, and minimum path-metric value update processing, and wherein said latches enable parallel pipeline processing by alternately using two-phase clock signals.

3. A viterbi decoder comprising:

a path-metric calculation unit including first and second path-metric memories for storing path-metric values of respective states, first and second flip-flops for holding path-metric values read out from said first and second path-metric memories at a trailing or leading edge of a clock signal, first and second subtracters for subtracting a minimum path-metric value during one previous decoding time from outputs from said first and second flip-flops, third and fourth flip-flops for holding outputs from said first and second subtracters at the leading or trailing edge of the clock signal reversely to said first and second flip-flops, first and second adders for respectively adding first and second branch metrics with outputs from said third and fourth flip-flops, fifth and sixth flip-flops for holding outputs from said first and second adders at the trailing or leading edge of the clock signal similarly to said first and second flip-flops, a first comparator for comparing an output from said fifth flip-flop with an output from said sixth flip-flop, a first selector for selecting a smaller one of the outputs from said fifth and sixth flip-flops in accordance with an output from said first comparator, and a seventh flip-flop for holding an output from said selector at the leading or trailing edge of the clock signal reversely to said first and second flip-flops; and a minimum path-metric value detector including an eighth flip-flop, a second comparator for comparing an updated path-metric value as an output from said seventh flip-flop with an output from said eighth flip-flop, a second selector for selecting a smaller one of the outputs from said seventh and eighth flip-flops in accordance with an output from said second comparator, and a ninth flip-flop for holding an output from said second selector at a trailing or leading edge of a minimum value update signal similarly to the clock signal for said first and second flip-flops, said eighth flip-flop holding the output from said second selector at the leading or trailing edge of the clock signal reversely to said first and second flip-flops.

4. A viterbi decoder comprising:

a path-metric calculation unit including first and second path-metric memories for storing path-metric values of respective states, first and second latches for holding path-metric values read out from said first and second path-metric memories in response to a second clock signal, first and second subtracters for subtracting a minimum path-metric value during one previous decoding time from outputs from said first and second latches, third and fourth latches for holding outputs from said first and second subtracters in response to a first clock signal, first and second adders for respectively adding first and second branch metrics with outputs from said third and fourth latches, fifth and sixth latches for holding outputs from said first and second adders in response to the second clock signal, a first comparator for comparing an output from said fifth latch with an output from said sixth latch, a first selector for selecting a smaller one of the outputs from said fifth and sixth latches in accordance with an output from said first comparator, and a seventh latch for holding an output from said selector in response to the first clock signal; and a minimum path-metric value detector including an eighth latch, a second comparator for comparing an updated path-metric value as an output from said seventh latch with an output from said eighth latch, a second selector for selecting a smaller one of the outputs from said seventh and eighth latches in accordance with an output from said second comparator, and a ninth latch for holding an output from said second selector in accordance with a minimum value update signal, said eighth latch holding the output from said second selector in response to the second clock signal.

5. A viterbi decoder for decoding a code comprising:

an adding/comparing/selecting circuit (ACS) including a storage component, a subtracting component, an adding component, a comparing component, and a selecting component, all interconnected for producing an updated path-metric value based upon inputted branch metric values and minimum path-metric values from a previous decoding, said ACS also including a plurality of path-metric value holding devices disposed between respective ones of said storage, subtraction, adding, comparing and selecting components of said ACS, to enable parallel pipeline processing in said viterbi decoder.

6. The viterbi decoder according to claim 5, further comprising:

a minimum path-metric value detection circuit for comparing and selecting a current minimum path-metric value between said updated path-metric value and a previous minimum path-metric value.

7. The decoder according to claim 5, wherein said plurality of holding devices comprise flip-flops which enable parallel pipeline processing by alternately using leading and trailing edges of a clock signal.

8. A decoder according to claim 5, wherein said plurality of holding devices comprise latches enable parallel pipeline processing by alternately using two-phase clock signals.

* * * * *